METHOD OF ATTACHING LEADS TO SEMICONDUCTOR DEVICES
Filed March 6, 1961
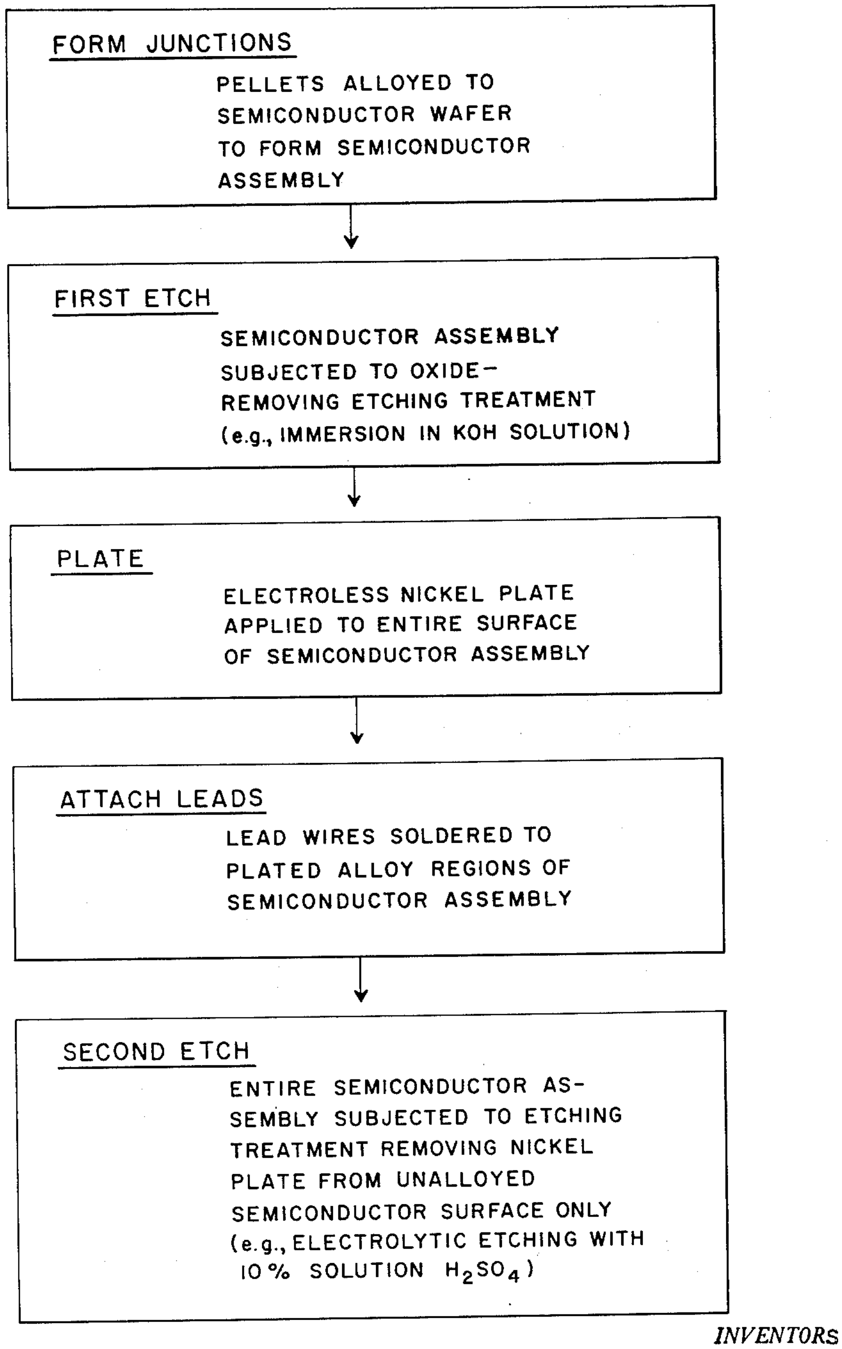
*INVENTORS*
HORST W. KNAU
GEORGES R. CALON
*BY* Francis L. Masselle
ATTORNEY United States Patent Office 3,146,514

Patented Sept. 1, 1964

3,146,514
METHOD OF ATTACHING LEADS TO SEMICONDUCTOR DEVICES

Horst W. Knau, Freiburg-Lehen, and Georges R. Calon, Freiburg im Breisgaw, Germany, assignors to Clevite Corporation, a corporation of Ohio Filed Mar. 6, 1961, Ser. No. 93,494
Claims priority, application Germany Mar. 11, 1960
5 Claims. (Cl. 29—25.3)

This invention relates to a method of fabricating semiconductor devices such as transistors and diodes and particularly to a method for attaching lead wires to a semiconductor device having junctions alloyed with aluminum, aluminum alloy, or other materials in which the rapid formation and substantially continuous presence of a surface oxide layer constitute an impediment to good electrical contact and solder connection of lead wires.

As will be more fully appreciated as this description proceeds, the problem sought to be eliminated by the present invention is encountered at the present time primarily in the fabrication of silicon devices, as aluminum or aluminum alloys (e.g., aluminum-silicon alloys) are widely employed for alloying the rectifying junctions. For this reason the invention is described herein with specific reference to its application to aluminum-alloyed silicon devices. It will be appreciated however, that the basic principle is applicable to devices of any semiconductor material with aluminum or aluminum alloys or with other metals forming oxide films of a similar nature.

The difficulty of attaching lead wires to aluminum-alloyed silicon transistors and diodes is well-known in the art. Devices of this type are fabricated by alloying to opposite sides of a wafer of silicon small pellets of aluminum or an aluminum-silicon alloy. The pellets not only result in the formation of the rectifying junction but the recrystallized pellet serves as the electrode by means of which the junction is associated with external circuitry. It is necessary therefore to connect a lead wire to the recrystallized pellet, which consists primarily of or contains a high percentage of aluminum.

The difficulty in attaching the lead wire stems from the well-known fact that aluminum is highly reactive and forms a surface oxide layer almost immediately upon exposure to any oxygen-bearing atmosphere. Due to its relatively high melting point this oxide layer makes difficult the connection of the lead wire by means of the customary soldering or welding techniques.

Numerous methods are available and widely employed for removal of the aluminum oxide film by means of chemical or mechanical treatment prior to attachment of the lead wire; to prevent the formation of a new oxide layer during the interval between removal of the original layer and completion of the soldering, it is a common practice to apply a protective nickel plating to the alloyed regions.

Because the plating must be carefully confined to avoid coverage of the semiconductor surface, selective plating techniques heretofore have been employed. However, due to the extremely small size of the units as a whole and more so the areas to be discriminated, the selective plating processes, whatever its particular form, is very tedious and requires a high degree of skill and dexterity on the part of the operator.

It is a fundamental general object of the present invention to alleviate the problems extant in the prior art as outlined above.

A more particular object of the invention is to facilitate the attachment of lead wires to aluminum-alloyed semiconductor devices.

Another object is the provision of a novel method, for providing aluminum-alloyed regions of a silicon semiconductor device with an electrically conductive protective plating, which is devoid of tedious and delicate procedures involved in selective plating.

These and additional objects of the invention may be fulfilled by a method of fabricating semiconductive devices which comprises subjecting an assembly consisting of a semiconductor with junction-forming regions alloyed thereon to an etching treatment adapted to remove surface oxides; immediately thereafter applying an electroless protective plating to the assembly; soldering lead wires to the plated alloyed regions; and etching the assembly to remove the plating from the unalloyed surface regions of the semiconductor.

Additional objects of the invention, its advantages, scope, and the manner in which it may be practiced will be more readily apparent to persons conversant with the art from the following description thereof, with reference to a specific exemplary embodiment, taken in conjunction with the subjoined claims and the annexed drawing in which the single figure constitutes a flow diagram setting forth the principal sequential steps involved in the method contemplated by the invention.

As is well-known in the art alloyed junctions are formed by placing in contact with one or more surfaces of a semiconductor material, silicon in the present example, a pellet or preform of the alloying material and then heating and cooling the wafer and pellet to cause alloying and recrystallization. As previously mentioned aluminum or an aluminum alloy, such as the eutectic alloy of aluminum and silicon, are, for reasons not germane to the present invention, employed to alloy semiconductor wafers of silicon.

In the fabrication of diodes only a single junction is alloyed; in transistors of conventional design two junctions are formed by alloying pellets on opposite faces of a thin wafer of the semiconductive silicon. The basic alloying procedure as well as many variant forms are so well-known as to make further description unnecessary. At this stage of fabrication, i.e., after alloying, the wafer, with whatever number of junctions are applied, will hereinafter be referred to as the "semiconductor assembly."

Referring to the flow diagram, the second step consists of etching the assembly to cleanse it and particularly to remove the surface oxide film, especially from the alloyed regions. For reasons which will become apparent as this description proceeds, etching of the semiconductor surface is of secondary importance only, at this stage, and therefore the etching treatment should be selected with a view to optimum effectiveness in the removal of the oxide film from the aluminum alloyed regions. In this connection a five percent solution of potassium hydroxide (KOH) has been found to be satisfactory. The solution can be heated if necessary or desired. The entire assembly is immersed in the etching fluid for whatever period of time may be required to accomplish substantially complete removal of the oxide film, at least from the aluminum alloy regions.

Immediately following the first etching treatment, the assembly is immersed entirely in an electroless nickel plating solution. Any known solution capable of autocatalytic reduction and deposition of a cohesive adherent layer of metallic nickel on an aluminum containing surface is satisfactory for this purpose. During the plating, nickel ions inevitably are deposited on the surface of the semiconductor wafer. However, the affinity of the metal ions for aluminum is greater than for silicon with the result that, while the requisite plating in terms of thickness, cohesion and continuity is formed on the alloyed regions, only relatively minor amounts are deposited on the silicon surface. Consequently, regulating the plating time to the minimum required to obtain only the necessary thickness of the nickel plating on the alloy regions, the thickness of the deposit on the semiconductor surface can be kept quite thin.

Upon the completion of the nickel plating, lead wires are easily soldered to the nickel plated alloyed regions in a conventional manner.

After attachment of the leads the assembly is subjected to an electrolytic etching for the purpose of removing entirely the thin coating of nickel deposited on the silicon surface during the plating step. An etchant consisting of a ten percent solution of sulfuric acid has been found suitable for this purpose. This second etching removes the thin relative non-cohesive layer of nickel from the silicon surface without unduly attacking the solder connection between the lead wires and the aluminum alloyed regions of the device.

The time of etching is, of course, limited to that necessary to achieve the desired effect on the silicon surface and is not unduly prolonged thereafter. The second etch can, of course, be relied on and utilized to complete any cleansing of the silicon surface which may not have been fully accomplished by the initial etching due to its selection and use with preference for its effectiveness on the alloyed regions as previously explained.

From the foregoing description it will be appreciated that a paramount advantage of the method contemplated by the present invention resides in the fact that individual handling and treatment of the semiconductor assembly for selective plating of the alloyed regions is rendered unnecessary. In contrast it is possible to dip large batches of the alloyed semiconductor assemblies into the electroless nickel plating bath.

The method, of course, depends on the preferential affinity of the nickel ions in the electroless plating bath for the aluminum alloyed regions, rather than the unalloyed silicon. It is possible therefore that in applying the method to a specifically different combination of semiconductor and alloy, a protective and conductive plating of a metal other than nickel may be necessary or preferred.

While there has been described what at present is believed to be the preferred embodiment of this invention, it will be obvious to those skilled in the art that various changes and modifications may be made therein without departing from the invention, and it is aimed, therefore, to cover in the appended claims all such changes and modifications as fall within the true spirit and scope of the invention.

What is claimed and desired to be secured by U.S. Letters Patent is:

1. A method of fabricating semiconductor devices having rectifying junctions, comprising: subjecting an assembly, consisting of a semiconductor having a surface including a junction-forming alloyed region and other unalloyed regions, to an etching treatment adapted to remove surface oxides; immediately thereafter, placing the entire surface of the assembly in contact with an electroless plating solution for a period of time sufficient to effect deposition of a substantially continuous coherent and cohesive plating on said alloyed region with concomitant deposition of a thinner plating of nickel on said unalloyed regions; soldering lead wires to the plated alloyed region; and etching the assembly to remove plating from the unalloyed regions of the semiconductor.

2. A method of fabricating silicon semiconductor devices, comprising: subjecting an assembly consisting of a silicon wafer having a surface including an aluminum-containing alloyed junction-forming region and other unalloyed regions, to an etching treatment to remove substantially all surface oxides; immediately thereafter immersing the entire assembly in an electroless nickel-plating solution for a period of time sufficient to the formation of a coherent continuous plating of nickel on the aluminum-containing alloyed region of said assembly with concomitant formation of a thinner plating of nickel on said unalloyed regions; soldering lead wires to the nickel plated alloyed regions of the assembly; and etching the assembly to remove entirely any nickel plating on the unalloyed regions of the semiconductor wafer.

3. A method according to claim 2 wherein the final etching is an electrolytic etching with a ten percent solution of sulfuric acid.

4. A method of fabricating semiconductor devices comprising: preparing a semiconductor assembly which includes a body of semiconductive silicon having at least one pellet of a material selected from the group consisting of aluminum and aluminum alloys alloyed thereto so as to form a rectifying junction; subjecting said assembly to an etching treatment effective to remove surface oxides from said pellet; immediately thereafter immersing said assembly in an electroless nickel plating solution for a period of time sufficient to effect deposition on said pellet of a continuous coherent nickel plating with concomitant deposition of a thinner plating on the surface of the silicon; soldering leads to the nickel-plated pellet; and electrolytically etching the entire assembly to remove the nickel-plating on the surface of the semiconductive silicon without disruption of the solder connection of said lead wire.

5. A method of fabricating semiconductor devices comprising: preparing a semiconductor assembly which includes a body of semiconductive silicon having at least one pellet of a material selected from the group consisting of aluminum and aluminum alloys, alloyed thereto so as to form a rectifying junction; immersing the entire assembly in an etchant fluid consisting of the five percent solution of potassium hydroxide for a sufficient length of time to effect substantially complete removal of surface oxides from said pellet; immediately thereafter immersing the entire assembly in an electroless nickel plating solution for a period of time sufficient to effect deposition on said pellet of a continuous coherent nickel plating with concomitant deposition of a thinner plating on the surface of the silicon; soldering a lead wire to said nickel plated pellet; and electrolytically etching the entire assembly in a ten percent solution of sulfuric acid for a period of time sufficient to remove the nickel plating from the surface of the unalloyed silicon without disruption of the solder connection of said terminal lead wire to said nickel plated pellet.

References Cited in the file of this patent

UNITED STATES PATENTS

| | | |
|---|---|---|
| 2,783,197 | Herbert | Feb. 26, 1957 |
| 2,857,321 | Williams | Oct. 21, 1958 |
| 2,878,147 | Beale | Mar. 17, 1959 |
| 2,906,647 | Roschen | Sept. 29, 1959 |
| 3,088,888 | Leff | May 7, 1963 |